United States Patent [19]

Hashimoto et al.

[11] Patent Number: 4,675,252
[45] Date of Patent: Jun. 23, 1987

[54] BASE MATERIAL HAVING A DYED MEMBRANE ON THE SURFACE THEREOF, AND METHOD FOR DYEING A MEMBRANE THEREON

[75] Inventors: Matsuo Hashimoto, Shinmachi; Masayuki Kiyomoto, Asa; Yoshimitsu Karasawa, Fujioka; Kenji Sakamoto, Takasaki; Yasuhiko Kakui, Maebashi; Yutaka Hirasawa, Ohmiya, all of Japan

[73] Assignee: Nippon Kayaku Kabushiki Kaisha, Tokyo, Japan

[21] Appl. No.: 816,125

[22] PCT Filed: Apr. 18, 1985

[86] PCT No.: PCT/JP85/00216
§ 371 Date: Dec. 11, 1985
§ 102(e) Date: Dec. 11, 1985

[87] PCT Pub. No.: WO85/04912
PCT Pub. Date: Nov. 7, 1985

[30] Foreign Application Priority Data

Apr. 18, 1984 [JP] Japan ............................ 59-76624
Nov. 16, 1984 [JP] Japan ........................... 59-240495

[51] Int. Cl.⁴ .................. B32B 17/10; B32B 27/30; D06P 1/41; G02B 5/20
[52] U.S. Cl. ............................ 428/431; 428/442; 428/520; 8/506; 350/311
[58] Field of Search ................ 8/506; 428/431, 442, 428/520; 350/311

[56] References Cited

U.S. PATENT DOCUMENTS 3,009,017 11/1961 Conner et al. .................. 8/506 X
3,763,118 2/1973 Ulrich et al. .................. 260/78.5 T

FOREIGN PATENT DOCUMENTS 7314701 4/1973 France .
4846061 4/1973 Japan .
7117689 7/1982 Japan .
1378997 4/1972 United Kingdom .

OTHER PUBLICATIONS

Chemical Abstracts, vol. 98, 1983, p. 306.

*Primary Examiner*—John E. Kittle
*Assistant Examiner*—Cynthia Hamilton
*Attorney, Agent, or Firm*—Oblon, Fisher, Spivak, McClelland & Maier

[57] ABSTRACT

Disclosed herein is a base material having dyed membrane(s) on the surface thereof, the dyed membrane(s) being obtained by a process comprising the steps of applying a photoreactive resin composition (D), which comprises (i) a copolymer (A) of a vinyl monomer having photosensitive group(s) and another vinyl monomer which is copolymerizable with the vinyl monomer having photosensitive group(s) and has group(s) having an affinity for an anionic dyestuff, (ii) an initiator (B) of photo-reaction as an optional component of the photoreactive resin composition (D) and (iii) a solvent (C), onto the surface of the base plate, thereby forming a membrane from the thus applied resin composition (D) on the surface of the base material, irradiating the thus formed membrane(s) with activating light, thereby initiating a reaction in the membrane, and thereafter dyeing the thus treated membrane with the anionic dye. The thus obtained base material having a dyed membrane on the surface thereof is useful as color filters for use in liquid crystal color television set, etc.

9 Claims, No Drawings

BASE MATERIAL HAVING A DYED MEMBRANE ON THE SURFACE THEREOF, AND METHOD FOR DYEING A MEMBRANE THEREON

INDUSTRIAL FIELD UTILIZING THE INVENTION

The present invention relates to a base material such as glass and the like having a membrane dyed by an anionic dyestuff on the surface thereof, and a method for dyeing a membrane on the surface thereof.

In recent years, coloured base materials prepared by coloring various transparent base materials such as glass and the like have been used in various kinds of displays. Particularly, transparent, colored base materials prepared by coloring a transparent base material such as glass and the like are useful as color-resolving filters, and the demand therefor has been increased by the use for the liquid crystal color television set and the colorization of the cameras for color television set.

The present invention has been accomplished for fulfilling the demand and relates to a transparent base material such as glass and the like having a dyed membrane on the surface thereof and a method for dyeing a membrane on the surface of the base material.

CONVENTIONAL TECHNIQUES

Hitherto, in this technical field, a method for dyeing a membrane of natural high polymeric material of protein such as casein, gelatin and the like has mainly been used.

According to the method, an aqueous solution prepared by adding potassium bichromate or ammonium bichromate as a photo-curing agent in an aqueous solution of casein, gelatin and the like in warm water is spin-coated on one of the surfaces of a glass plate, then the thus coated glass plate was irradiated with an activating light via a mask, thereby forming a latent image of a dyeable layer on the glass plate, and after actualizing the dyeable layer by developing thereof, the thus actualized dyeable layer is dyed by a dyestuff.

PROBLEMS TO BE RESOLVED BY THE INVENTION

In practicing the method for dyeing by utilizing casein, gelatin and the like, the following various defects of the process have been experienced.

Casein, gelatin and the like are easily putrefied because they are natural products; their quality varies widely depending on the material source, thereby causing an extremely poor reproducibility of colours; since the membrane made of casein, gelatin and the like is easily exfoliated from the glass plate when immersed in hot water; and their physical properties are largely deteriorated thermally and the conditions for dyeing method are restricted.

In addition, there is a problem in the conventional method that deep colour hardly is obtained due to the limitation of the temperature of the dyebath in dyeing.

Further, there are problems due to the use of potassium bichromate or ammonium bichromate as a photo-curing agent in the case of utilizing casein, gelatin and the like, for instance, a problem of environmental pollution in the operational steps and in the case of waste-disposal and of a bad influence of the remaining chromium in gelatin of the product.

In order to resolve the above-mentioned problems, the present inventors have examined the synthetic high polymers for use in dyeing method. At first, the present inventors tried, after coating the surface of the base material with a polymer having group(s) which has an affinity for an anionic dyestuff or having quaternary ammonium salt group(s), to dye the membrane formed from the polymer on the surface of the base material.

In such a case, since the polymer itself has an affinity for an anionic dyestuff, the polymer is dyeable. However, since the polymer is soluble in water, the dried membrane on the base material, which has been prepared by coating the polymer on the surface of the base material such as glass and the like and drying the thus coated polymer, was exfoliated in the case of immersing the thus prepared base material in a dye bath for dyeing. Namely, it is not possible to dye the membrane on the surface of the base material nor to obtain a coloured base material.

MEANS FOR SOLVING THE PROBLEMS

As the results of the examination and studies of the present inventors for solving the above-mentioned problems, the present inventors have found that a base material having an excellent dyed membrane on the surface thereof can be obtained by (i) coating a photoreactive resin composition (D) which comprises a copolymer (A) of a vinyl monomer having photosensitive group(s) and another vinyl monomer being copolymerizable with the vinyl monomer and having an affinity for an anionic dyestuff, an initiator (B) of a photo-reaction as an optional component and a solvent (C), on the surface of a base material, thereby forming a membrane thereon, (ii) irradiating the thus formed membrane on the surface of the base material with an activating light and then (iii) dyeing the thus irradiated membrane on the surface of the base material with an anionic dyestuff.

Since the copolymer (A) of the present invention is dyeable with an anionic dyestuff due to the affinity of the copolymer (A) itself for an anionic dyestuff, the membrane on the base material can be easily dyed with an anionic dyestuff in the case of using the copolymer (A) of the present invention as the raw material of the membrane. In addition, since the copolymer (A) is cross-linkable, the copolymer (A) itself forms a water-insoluble membrane on the surface of the base material such as glass and the like when it is irradiated with the activating light, and accordingly, the exfoliation of the membrane does not occur when the thus prepared base material is immersed into the dye bath for dyeing.

Further, according to the present invention, colored base materials of a stabilized quality are available without any fear of putrefaction of the membrane thereon and fear of environmental pollution due to hexavalent chromium.

As the vinyl monomer having photosensitive group(s) for use in the present invention as a raw material for the copolymer (A), for instance, p-cinnamoyloxystyrene, $\beta$-cinnamoyloxyethyl vinyl ether, $\beta$-cinnamoyloxyethyl acrylate or methacrylate, p-(cinnamoyloxymethyl)styrene, p-cinnamylideneacetoxystyrene, $\beta$-(furfurylacryloyloxy)ethyl acrylate or methacrylate, 7-acryloyloxycoumarin, 7-methacryloyloxycoumarin, 6-hydroxymethylcoumarin acrylate or methacrylate, $\beta$-(p-cinnamoylphenoxyethyl) vinyl ether, p-($\beta$-styrylphenyl) acrylate or methacrylate, p-phenylmaleimidoacetoxystyrene, 4'-methacryloyloxy-4-stilbazole, 1-methyl-4-(p-methacryloyloxystyryl)-pyridinium methosulfate, etc. may be exemplified. They may be used singly or may be used as a mixture of two or more of them.

As the vinyl monomer which has group(s) having an affinity for the anionic dyestuff, as a raw material for the copolymer (A) in the present invention, those vinyl monomers having tertiary amino group(s) or quaternary ammonium salt group(s) are preferable, for instance, (N,N-dimethylamino)ethyl acrylate, (N,N-dimethylamino)ethyl methacrylate, (N,N-diethylamino)ethyl acrylate, (N,N-diethylamino)ethyl methacrylate, (N,N-dimethylamino)propyl acrylate, (N,N-dimethylamino)propyl methacrylate, (N,N-dimethylamino)propyl acrylamide, (N,N-diethylamino)ethyl vinyl ether, 4-vinylpyridine, diallylamine, 2-hydroxy-3-methacryloyloxypropyltrimethylammonium chloride. methacryloyloxyethyltrimethylammonium chloride, methacryloyloxypropyltrimethylammonium chloride, acryloyloxyethyltrimethylammonium chloride, acryloyloxypropyltrimethylammonium chloride, etc. may be exemplified. They may be used singly or may be used as a mixture of two or more of them. In addition, if preferred, another monomer which is copolymerizable with any one of the above-mentioned monomers, for instance, methyl acrylate, methyl methacrylate, ethyl acrylate, ethyl methacrylate, styrene, etc. may be used as a component of the monomers for preparing the copolymer (A) together with the above-mentioned monomer(s).

The ratio of the amount of the vinyl monomer having photosensitive group(s) to the amount of the vinyl monomer which has group(s) having an affinity for an anionic dyestuff and is copolymerizable with the above-mentioned vinyl monomer in the copolymer(A) depends on the desired strength of the membrane of the copolymer (A). The greater the content of the vinyl monomer having photosensitive group(s) the greater is the strength of the membrane and vice versa. For achieving the object of the present invention, the molar ratio of the vinyl monomer having photosensitive group(s) in the copolymer (A) is preferably 0.2 to 30 mol %, particularly 1 to 20 mol %.

In addition, in the case where the content of the vinyl monomer which has group(s) having an affinity for an anionic dyestuff is higher, there is an effect that the dyeability of the copolymer (A) is excellent, however, in consideration of the effect of the vinyl monomer having photosensitive group(s), the molar ratio of the vinyl monomer which has group(s) having an affinity for an anionic dyestuff is not less than 20 mol % in the copolymer (A), preferably not less than 40 mol %. The copolymer (A) may be prepared by mixing the vinyl monomer having photosensitive groups and the vinyl monomer which has group(s) having an affinity for an anionic dyestuff at a suitable ratio, and after diluting the monomeric mixture with a solvent, if necessary, subjecting the monomeric mixture to copolymerization in the absence of any activating-light while following the conventional technique of polymerization.

Furthermore, as the copolymer (A) for use in the present invention, a copolymer having both photosensitive group(s) and quaternary ammonium salt group(s) in the same side chain thereof may be used. Such a copolymer having both photosensitive group(s) and quaternary ammonium salt group(s) in a side chain thereof may be prepared by various methods, for instance, a method of reacting a homopolymer or a copolymer obtained by polymerizing a monomer having tertiary amino group(s) with a compound having active halogen atom(s) and carbon-carbon unsaturated bond(s), or a method of reacting a homopolymer or a copolymer obtained by polymerizing a monomer having active halogen atom(s) with a compound having tertiary amino group(s) and carbon-carbon unsaturated bond(s).

As a monomer having tertiary amino group(s) or a compound having tertiary amino group(s) and carbon-carbon unsaturated bond(s), for instance, (N,N-dimethylamino)ethyl acrylate, (N,N-dimethylamino)ethyl methacrylate, (N,N-diethylamino)ethyl acrylate, (N,N-diethylamino)ethyl methacrylate, (N,N-dimethylamino)propyl acrylate, (N,N-dimethylamino)propyl methacrylate, (N,N-dimethylamino)propyl acrylamide, (N,N-diethylamino)ethyl vinyl ether, 4-vinylpyridine, etc. may be exemplified. They may be used singly, or a mixture of two or more of them may be used, and if preferable, another monomer which is copolymerizable with any of them, for instance, methyl acrylate, methyl metrhacrylate, ethyl acrylate, ethyl methacrylate, styrene, etc. may be used as a component of the monomeric mixture for copolymerization.

As a compound having active halogen atom(s) and carbon-carbon unsaturated bond(s) or a monomer having halogen atom(s), for instance, allyl chloride, allyl bromide, 3-chloro-2-methylpropene, 3-chloro-1-methylpropene, 4-bromo-1-butene, allyl chloroacetate, vinyl chloroacetate, gamma-chloro-isobutene, m-chloromethylstyrene, p-chloromethylstyrene, crotyl bromide, 3-chloro-2-hydroxypropyl methacrylate, β-chloroethyl cinnamate

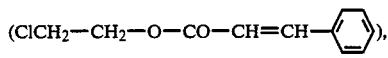

β-bromoethyl cinnamate

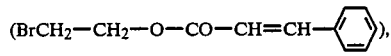

β-bromoethyl cinnamylideneacetate

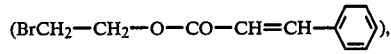

β-bromoethyl furylacrylate

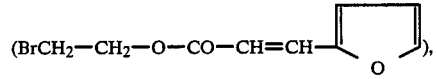

p-β-bromoethyloxycarbonylbenzalacetophenone

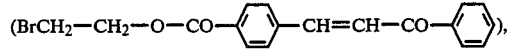

4-chloroacetoxystilbene

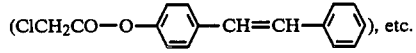

may be exemprified. They may be used singly or a mixture of two or more of them may be used.

The ratio of the above-mentioned raw materials for use in preparing the copolymer (A) may be preferably as follows.

Namely, in the case where a homo- or copolymer obtained by polymerizing a monomer having tertiary amino group(s) is reacted with the compound having active halogen atom(s) and carbon-carbon unsaturated bond(s), it is preferable to use 0.2 to 300 mol of a monomer having active halogen atom(s) and carbon-carbon unsaturated bond(s) to 100 mols of a vinyl monomer having tertiary amino group(s). In the case where a homopolymer or copolymer obtained by polymerizing a vinyl monomer having halogen atom(s) is reacted with a compound having tertiary amino group(s) and carbon-carbon unsaturated bond(s), it is preferable to use 20 to 300 mols of a compound having tertiary amino group(s) and carbon-carbon unsaturated bond(s) to 100 mols of a vinyl monomer having halogen atom(s). In the thus obtained copolymer (A), it is preferable that the ratio of the amount of the structural monomeric unit having both photosensitive group(s) and quaternary ammonium salt group(s) in the total structural monomeric units is 0.2 to 30 mol %, particularly 1 to 20 mol %, and that the ratio of the amount of the "structural monomeric unit which has group(s) having an affinity for an anionic dyestuff" in the total structural monomeric units is not less than 20 mol %, particularly not less than 40 mol %.

The molecular weight of the copolymer (A) is preferably not less than 500.

As an initiator (B) of the photo-reaction, which is an optional component, which initiates the reaction when a reactant mixture is irradiated with an activating light, the following compounds may be exemplified.

Nitrobenzene, p-nitrodiphenyl, m-nitroaniline, p-nitroaniline, 2,4-dinitoaniline, picramide, 2-chloro-4-nitroaniline, 2,4,6-trinitroaniline, p-nitrophenol, 9-anthraldehyde, acetophenone, benzophenone, dibenzalacetone, benzil, p,p'-dimethylaminobenzophenone, p,p'-tetramethyldiaminobenzophenone(Michler's ketone), 1,4-naphthoquinone, anthraquinone, 1,2-benzanthraquinone, 2-ethylanthraquinone, 2-t-butylanthraquinone, benzoin, diacetyl, 1,9-benzanthrone, 2-keto-3-aza-1,9-benzanthrone, 3-methyl-1,3-diaza-1,9-benzanthrone, 2-nitrofluorene, 2,7-dinitrofluorene, 2,5-dinitrofluorene, 1,8-phthaloylnaphthalene, 2-chloro-1,8-phthaloylnaphthalene, 4-chloro-1,8-phthaloylnaphthalene, 4-bromo-1,8-phthaloylnaphthalene, 5,6-dinitroacenaphthene, 5-benzoylacenaphthene, acenaphthene, pyrene, acridone, α-naphthoquinone, 5-nitroacenaphthene, 1-nitropyrene, chloro-1,2-benzanthraquinone, 9-fluorenone, diphenyl disulfide, p-nitrobenzaldehyde, p-benzoquinone, phenol, anthrone, benzaldehyde, phenanthrene, naphthalene, chrysene, 2-benzoylmethylene-1-methylnaphthothiazoline, N-acetyl-4-nitro-1-naphthylamine, benzoquinone, 4-nitro-1-naphthylamine and anthracene. They may be used singly, or a mixture of two or more of them may be used. It is preferable to use not more than 30 parts by weight, particularly not more than 10 parts by weight, of the initiator (B) to 100 parts by weight of the copolymer (A).

As the solvent (C) for use in the present invention, a solvent which dissolves both the copolymer (A) and the initiator (B) of photo-reaction is preferable, and 2-methoxyethanol, 2-ethoxyethanol, toluene, xylene, ethylene glycol monoethyl ether acetate, N-methyl-2-pyrrolidone, etc. may be exemplified. They may be used singly, or a mixture of two or more of them may be used. Although the ratio of the solvent (C) in the photoreactive resin composition (D) depends on the properties of the copolymer (A) and the initiator (B) of photo-reaction, it is preferable to use the solvent (C) in an amount so as to make the viscosity of the photoreactive resin composition less than 1000 cps, particularly less than 800 cps.

Although the photoreactive resin composition (D) of the present invention comprises the copolymer (A), the initiator (B) of photo-reaction as an optional component and the solvent (C), another monomer copolymerizable with the copolymer (A) may be further added to the photoreactive resin composition (D).

As such an additional monomer, a compound having two or more photosensitive groups is preferably used and the following compounds may be exemplified.

Ethylene glycol diacrylate, diethylene glycol diacrylate, triethylene glycol diacrylate, polyethylene glycol diacrylate, polyethylene glycol dimethacrylate, polypropylene glycol diacrylate, polypropylene glycol dimethacrylate, butylene glycol diacrylate, butylene glycol dimethacrylate, neopentyl glycol diacrylate, neopentyl glycol dimethacrylate, 1,4-butanediol diacrylate, 1,6-hexanediol diacrylate, 1,6-hexanediol dimethacrylate, pentaerythritol diacrylate, pentaerythritol triacrylate, trimethylolpropane triacrylate, trimethylolpropane trimethacrylate, novolak-epoxyacrylate, bisphenol A-epoxyacrylate, alkylene glycol diepoxyacrylate, glycidyl ester acrylate, polyester-diacrylate, bisphenol-A diacrylate and urethane diacrylate.

By adding the above-mentioned additional monomer to the photoreactive resin composition (D), the strength and the transparency of the membrane which is formed on the surface of the base material can be improved further.

In the case of using the above-mentioned additional monomer, it is preferable to use the additional monomer in an amount which does not affect the dyeability of the cured membrane on the base material, namely, it is preferable to use not more than 200% by weight, preferably not more than 20% by weight of the additional monomer to the copolymer (A).

The photoreactive resin composition (D) according to the present invention may further contain a viscosity regulating agent, a defoaming agent, etc.

After applying the above-mentioned photoreactive resin composition (D) onto the surfaces of a base material, the solvent in the composition (D) volatilizes to leave a resinuous membrane on the surface of the base material. According to the method of the present invention, it is possible to prepare a membrane of an optional thickness of 0.5 to 100 μm.

As the base material on which the photoreactive resin composition (D) of the present invention is coated, glass, a synthetic resin (for istance, synthetic acrylic resin), etc. may be exemplified, however, various material may be used without limitation.

As the activating light for use in the present invention, visible light, ultraviolet rays, X-rays, electron beams, etc. may be exemplified.

The cured resin of the thus formed membrane is dyed with an anionic dyestuff.

As the dyestuff for use in the present invention, acid dyes disclosed in "Colour Index", published by Society of Dyers and Colourists, as C.I. Acid; direct dyes disclosed also in "Colour Index" as C.I. Direct; reactive dyes disclosed also in "Colour Index" as C.I. Reactive, etc. may be exemplified, however, particularly the acid dyes are preferable. As the acid dyes for use in the present invention, C.I. Acid Yellow 17, 49, 67, 72, 110, 127, 135, 161; C.I. Acid Red 37, 50, 111, 114, 257, 266, 317; C.I. Acid Blue 41, 83, 90, 113, 129, 182, 125; C.I.

Acid Orange 7, 56; C.I. Acid Green 25, 41; C.I. Acid Violet 27, 28, 48 and 97 may be mentioned.

Dyeing is carried out while using an aqueous solution prepared by dissolving 0.01 to 200 parts by weight of the above-mentioned dyestuff in 1000 parts by weight of water. The thus prepared solution may be in the range of weakly alkaline to acidic. Although it is possible to carry out dyeing at a temperature of room temperature to 100° C., it is preferable to carry out dyeing at a high temperature, because the dyed material is available in a short time period of dyeing in the case of dyeing at a high temperature.

After carrying out dyeing in the above-mentioned manner, the dyed material is put out from the dyeing bath and dried to obtain a base material having a dyed membrane on the surface thereof.

The dyed base material according to the present invention is useful as a colour-filter for use in liquid crystal colour television, etc. Since the membrane prepared by curing the photoreactive resin composition used in the present invention is excellent in dyeability, it is possible to use the membrame of small in thickness and accordingly, it is possible to apply such a dyed base material onto the transparent electrode of liquid crystal colour television. In the case of using the dyed base material according to the present invention, the picture of TV set is remarkably bright as compared to the case of using the known base material.

[Example]

EXAMPLE 1

By subjecting a solution prepared by mixing the following reagents,
10 g of 4'-methacryloyloxy-4-stilbazole,
90 g of (N,N-dimethylamino)ethyl methacrylate,
200 g of 2-ethoxyethanol and
1 g of α, α'-azobis(isobutyronitrile)
to polymerization in nitrogen atmosphere at 60° C. for 5 hours in the absence of ultraviolet rays, the whole solution became a viscous liquid. By adding 200 g of 2-ethoxyethanol into the thus obtained viscous liquid, a photoreactive resin composition according to the present invention was prepared.

Separately, a 10% solution in ethanol of a silane-coupling agent KBM503 (made by SHINETSU Chemical Industry Co., Ltd.) was applied on a glass plate, and after air-drying, the thus treated plate was further dried by heating at 110° C. for 5 min and after washing the surface thereof with acetone, and thus washed plate was dried to obtain the base material to be coated with the photoreactive resin composition.

The surface of the thus obtained base material was spin-coated with the photoreactive resin composition so as to form a membrane of the resin thereon of a thickness of 0.8 μm. Thereafter, the thus coated surface was irradiated with an ultraviolet light (80 W/cm) for 1 sec to cure the thus formed membrane of the resin.

Then, the thus treated base material was subjected to dyeing while using an aqueous 1% solution (pH of 8.0) of a colouring matter for colour filters (made by Nippon Kayaku Co., Ltd. under the name of "Green 1P") at 60° C. for 10 min to obtain a glass plate having a transparent membrane dyed into deep green thereon.

In the same procedures as above except for respectively using Red 14P and Blue 4P (both being the colouring matters for colour filter, made by Nippon Kayaku Co., Ltd.) instead of Green 1P, glass plates respectively having transparent membranes dyed into deep red and blue.

EXAMPLES 2 to 5

Each of the solution prepared by mixing the reagents shown in the following table was polymerized in the same manner as in Example 1 to obtain a viscous liquid. By dissolving 200 g of 2-ethoxyethanol and as an initiator of a photoreaction 2.5 g of p,p'-tetramethyl-diaminobenzophenone (Michler's ketone) into each of the thus prepared viscous liquids, each of the photoreactive resin compositions was prepared.

After applying each of the resin compositions onto a glass plate in the same manner as in Example 1 so as to form a membrane of 0.9 μm, in thickness, the thus treated glass plate was irradiated with the ultraviolet rays to cure the membrane and then subjected to dyeing in the same manner as in Example 1, thereby obtaining glass plates having membranes dyed into deep green, red and blue, respectively.

TABLE

|  | Examples | | | |
| --- | --- | --- | --- | --- |
|  | 2 | 3 | 4 | 5 |
| β-cinnamoyloxyethyl acrylate | 15 g | 0 g | 0 g | 10 g |
| p-(β-styrylphenyl) acrylate | 0 | 13 | 0 | 0 |
| p-cinnamylideneacetoxystyrene | 0 | 0 | 12 | 0 |
| (N,N—dimethylamino)ethyl acrylate | 85 | 0 | 78 | 90 |
| (N,N—dimethylamino)ethyl methacrylate | 0 | 87 | 0 | 0 |
| 4-vinylpyridine | 0 | 0 | 10 | 0 |
| α,α'-azobis(isobutyronitrile) | 0.8 | 0.9 | 1.0 | 0.8 |
| 2-ethoxyethanol | 180 | 200 | 190 | 180 |

REFERENCE EXAMPLE 1

A solution prepared by mixing the following reagents set forth below was subjected to polymerization, coating, UV irradiation and dyeing in the same manner as in Example 1.

However, the membrane on the surface of the glass plate exfoliated from the glass plate, and accordingly, any transparent base plate having a dyed membrane on the surface thereof was not obtained.
100 g of (N,N-dimethylamino)ethyl methacrylate
200 g of 2-ethoxyethanol and
1 g of α,α'-azobis(isobutyronitrile)

For reference, in the following Examples, "part" means part by weight.

EXAMPLE 6

A solution prepared by mixing the following reagents set forth below was subjected to polymerization in a nitrogen atmosphere at 80° C. for 8 hours to obtain 100 parts of a solution of poly(N,N-dimethylamino)ethyl methacrylate.
69 parts of toluene
30 parts of (N,N-dimethylamino)ethyl methacrylate 1 part of α,α'-azobis(isobutyronitrile)

After adding 15 parts of a mixture of m-chloromethylstyrene and p-chloromethylstyrene to 50 parts of the thus obtained polymer solution at ordinary temperature, the whole mixture was subjected to reaction at ordinary temperature and after 16 hours a solid material was obtained. By dissolving the thus obtained solid material into 260 parts of 2-ethoxyethanol and adding 16 parts of a sensitizer (Irgacur ® 651, made by Ciba-Geigy Co.) to the thus prepared solution, a dyeable, photoreactive resin compound was prepared.

Separately, a 10% solution in ethanol of the same silane-coupling agent as in Example 1 (KBM 503, SHI-NETSU Chem. Ind. Co., Ltd.) was applied onto a glass plate, and after air-drying, it was further dried at 110° C. for 5 min, washed with acetone and further dried to prepare the base material to be applied with photoreactive resin composition.

Then, the photoreactive resin composition was spin-coated onto the surface of the base material so as to form a membrane of the resin of 1 μm in thickness on the surface of the base material. The thus formed membrane was nonsticky.

Thereafter, the thus coated base material was irradiated with ultraviolet rays (80 W/cm) for 4 sec to cure the membrane thereon.

When the thus prepared base material was immersed in a dye bath containing a 0.04% solution of dye made by dissolving Kayanol Floxine ® NK (made by Nippon Kayaku Co., Ltd.) into an aqueous solution of acetic acid of pH 3.3, at 90° C. for 20 min, a glass base plate having a transparent membrane dyed into bright red.

REFERENCE EXAMPLE 2

In the same manner as in Example 6 except for not adding chloromethylstyrene, a resin composition was obtained, and in the same manner as in Example 6, the step of coating, UV irradiation and dyeing was carried out. However, the thus obtained glass base plate had the opaque membrane only dyed to the extent of stains.

EXAMPLES 7 and 8 and REFERENCE EXAMPLES 3 and 4

By subjecting each glass plate having a membrane prepared in the same manner as in Example 6 or Reference Example 2 to dyeing, the glass plates having a dyed membrane were obtained, the conditions in dyeing and the results of dyeing being shown in Table 1.

EXAMPLE 9

Into 50 parts of a toluene solution of poly(N,N-dimethylamino)ethyl methacrylate produced in Example 6, 10 parts of allyl chloride were mixed, and the thus prepared mixture was reacted for 40 hours at room temperature, thereby obtaining a solidified material.

By dissolving the solidified material into 240 parts of 2-ethoxyethanol and adding 24 parts of R-166 (a diacrylate of epoxy compounds made by Nippon Kayaku Co., Ltd.) and 10 parts of Irgacure ® 651 (refer to Example 6, a sensitizer) into the thus prepared solution, a photoreactive resin composition was obtained. Then, the thus obtained resin composition was spin-coated onto a glass plate in the same manner as in Example 6 to form a membrane of 2 μm in thickness on the glass plate. The thus formed membrane was nonsticky and its processability was favorable.

The thus treated glass plate was irradiated for 4 sec with ultraviolet rays (80 W/cm) to cure the membrane thereon.

Thereafter, by subjecting the thus irradiated glass plate to dyeing at 90° C. for 18 min while using an aqueous solution (pH of 8.5) containing 0.05% of Kayarus Turqueise Blue GL ® (made by Nippon Kayaku Co., Ltd.), a glass base plate having a transparent membrane dyed into deep blue was obtained.

REFERENCE EXAMPLE 5

Into the solution of poly(N,N-dimethylamino)ethyl methacrylate in toluene of Example 9, 2-ethoxyethanol and Irgacure ® 651 were added in the same manner as in Example 9, however without adding allyl chloride, to obtain a resin composition. After spin-coating the thus obtained resin composition on a glass plate and irradiating the thus coated glass plate with ultraviolet rays, the glass plate was immersed into a dye bath to dye the resin membrane on the glass plate, in the same manner as in Example 9.

As a result, a glass base plate having a resin membrane was obtained, however, the resin membrane was dyed only to the extent of stains.

EXAMPLES 10 and 11 and REFERENCE EXAMPLES 6 and 7

By subjecting each glass plate having a membrane prepared in the same manner as in Example 9 or Reference Example 5 to dyeing, the glass base plates having a dyed membrane were obtained, the conditions in dyeing and the results of dyeing being shown in Table 2.

TABLE 1

| Membrane prepared according to | Example 7 | Reference Example 3 | Example 8 | Reference Example 4 |
|---|---|---|---|---|
| | Example 6 | Reference Example 2 | Example 6 | Reference Example 2 |
| Dyestuff | Kayanol Floxine NK ® (made by Nippon Kayaku) | | Kayanol Milling Red ® 3BW (made by Nippon Kayaku) | |
| Concentration of the dyestuff | 0.04% | | 0.03% | |
| pH of dye bath | 7.9 | | 8.2 | |
| Temperature of dye bath | 90° C. | | 90 to 98° C. | |
| Time period for dyeing | 20 min | | 5 min | |
| Results | a glass base plate having a membrane dyed into deep red was obtained | a glass base plate having a membrane only dyed to the extent of stains was obtained | a glass base plate having a membrane dyed into deep red was obtained | a glass base plate having a membrane only dyed to the extent of stains was obtained |

TABLE 2

| Membrane prepared according to | Example 10 | Reference Example 6 Reference Example 5 | Example 11 | Reference Example 7 Reference Example 5 |
|---|---|---|---|---|
| | Example 9 | | Example 9 | |
| Dyestuff | Kayanol Milling Green 5GW ® (made by Nippon Kayaku) | | Kayanol Floxine NK ® (made by Nippon Kayaku) | |
| Concentration of dyestuff | 0.045% | | 0.03% | |
| pH of dye bath | 3.15 | | 7.9 | |
| Temperature of dye bath | 93° C. | | 88° C. | |
| Time period for dyeing | 16 min | | 20 min | |
| Results | a glass base plate having a membrane dyed into deep green was obtained | a glass base plate having a membrane only dyed to the extent of stains was obtained | a glass base plate having a membrane dyed into deep green was obtained | a glass base plate having a membrane only dyed to the extent of stains was obtained |

EXAMPLES 12 and 13

Into 45 parts of 2-ethoxyethanol, 5 parts of poly(4-vinylpyridine) of a molecular weight of 12000 were dissolved, and after adding 8 parts of a mixture of m-chloromethylstyrene and p-chloromethylstyrene to the thus prepared solution, the mixture was reacted for 20 hours at room temperature.

Then, one part of Irgacure ® 651 was dissolved into the reaction product to obtain a photoreactive resin composition.

The thus prepared resin composition was spin-coated onto a glass plate in the same manner as in Example 6 to form a membrane of 2 μm in thickness on the glass plate. The thus formed membrane was non-sticky and its processability was favorable. After irradiating the thus treated glass plate with ultraviolet rays of 80 W/cm for 5 sec, the thus irradiated glass plate was subjected to dyeing under the conditions shown in Table 3.

REFERENCE EXAMPLES 8 and 9

Into the same solution of poly(4-vinylpyridine) in 2-ethoxyethanol as in Example 12, one part of Irgacure ® 651 was added to obtain a resin composition, and the thus obtained resin composition was spin-coated onto a glass plate. The thus treated glass plate was irradiated with ultraviolet rays and then subjected to dyeing in the similar manner as in Examples 12 and 13. The conditions of the dyeing are also shown in Table 3.

EXAMPLE 14

A solution prepared by mixing the reagents set forth below was subjected to polymerization in a nitrogen atmosphere at 80° C. for 8 hours by a conventional method to obtain 100 parts of a solution of poly(N,N-dimethylamino)ethyl acrylate.

69.5 parts of toluene,
30 parts of (N,N-dimethylamino)ethyl acrylate and
0.5 part of α,α'-azobis(isobutyronitrile)

After adding 15 parts of 4-bromo-1-butene into 50 parts of the thus obtained solution of the polymer, the mixture was reacted at ordinary temperature and after 70 hours the whole mixture solidified.

By dissolving the thus obtained solidified material into 260 parts of 2-ethoxyethanol and further dissolving 14 parts of Irgacure ® 651 into the thus prepared solution, a photoreactive resin composition was obtained.

Then, the thus obtained resin composition was spin-coated onto a glass plate in the same manner as in Example 6 to form a membrane of 1 μm in thickness on the glass plate. The membrane was not so sticky and its processability was favorable.

The thus treated glass plate was irradiated with ultraviolet rays (80 W/cm) for 6 sec to cure the membrane thereon.

Thereafter, the thus treated glass plate was subjected to dyeing in a dye bath of an aqueous 0.048% solution (pH of 8.0) of "Green 1P" (a colouring matter for colour filters, made by Nippon Kayaku Co., Ltd.) at 60° C. for 10 min in the same manner as in Example 6 to obtain

TABLE 3

| | Example 12 | Reference Example 8 | Example 13 | Reference Example 9 |
|---|---|---|---|---|
| Dyestuff | Kayanol Cyanine Green G ®[(1)] | | Kayanol Milling Green 5GW ®[(2)] | |
| Concentration of dyestuff | 0.038% | | 0.56% | |
| pH of dye bath | 3.3 | | 3.15 | |
| Temperature of dye bath | 90° C. | | 92° C. | |
| Time period for dyeing | 15 min | | 16 min | |
| Results | a glass base plate having a membrane dyed into deep green was obtained | a glass base plate having a membrane only dyed to the extent of stains was obtained | a glass base plate having a membrane dyed into deep green was obtained | a glass base plate having a membrane only dyed to the extent of stains was obtained |

Note:
[(1)] and [(2)] made by Nippon Kayaku Co., Ltd.

a glass base plate having a transparent membrane dyed into deep green thereon.

REFERENCE EXAMPLE 10

Into 50 parts of the same solution of poly(N,N-dimethylamino)ethyl acrylate in toluene as in Example 14, 260 parts of 2-ethoxyethanol and 14 parts of Irgacure ® 651 were added to obtain a resin composition.

After spin-coating the thus obtained resin composition onto a glass plate, irradiating the thus treated glass plate with ultraviolet rays under the same conditions as in Example 14, the thus treated glass plate was subjected to dyeing in the same manner as in Example 14 to obtain a glass base plate having a dyed membrane. However, the dyed membrane was opaque and partly exfoliated from the glass base plate. In short, the thus obtained glass base plate could not be put to practical use.

EXAMPLE 15

Into 50 parts of the same solution of poly(N,N-dimethylamino)ethyl acrylate as in Example 14, 15 parts of allyl chloroacetate were added, and the mixture was subjected to reaction at room temperature. After 20 hours of the reaction, the solidified reaction mixture was obtained. The thus obtained solidified material was dissolved in 240 parts of 2-ethoxyethanol, and by further adding 12 parts of Irgacure ® 651 to the thus prepared solution, a photoreactive resin composition was obtained.

By spin-coating the thus obtained resin composition onto a glass plate in the same manner as in Example 6, a glass plate having a non-sticky and favorably processable membrane of 1 μm in thickness thereon was obtained. After irradiating the thus treated glass plate with ultraviolet rays (80 W/cm) for 6 sec, thereby curing the membrane thereon, the thus treated glass plate was subjected to dyeing in the same manner as in Example 14 to obtain a glass base plate having a transparent membrane dyed to deep green thereon.

EXAMPLE 16

A solution prepared by mixing the reagents set forth below was subjected to polymerization in a nitrogen atmosphere at 80° C. for 8 hours to obtain 300 parts of a solution of a copolymer of (N,N'-dimethylamino)ethyl acrylate and (N,N'-dimethylamino)ethyl methacrylate.
207 parts of toluene,
45 parts of (N,N-dimethylamino)ethyl acrylate,
45 parts of (N,N-dimethylamino)ethyl methacrylate and
3 parts of α,α'-azobis(isobutyronitrile).

After adding 25 parts of β-bromoethyl cinnamate into 50 parts of the thus obtained solution of the copolymer, the mixture was subjected to reaction at room temperature and after 5 days of reaction, a viscous reaction mixture was obtained.

The yellow precipitate formed by adding the viscous mixture into petroleum ether was collected by filtration and dried under a reduced pressure to obtain a dried, solid material.

Then, 20 parts of the thus obtained solid material and 2 parts of Michler's ketone were mixed with 80 parts of 2-ethoxyethanol to obtain a photoreactive resin composition.

After spin-coating the thus obtained resin composition onto a glass plate in the same manner as in Example 6 to form a non-sticky and favorably processable membrane of 1 μm thereon, the thus treated glass plate was irradiated with ultraviolet rays (80 W/cm) for 5 sec to cure the membrane thereon, and then subjected to dyeing under the same conditions as in Example 14. As a result, a glass base plate having a transparent membrane dyed into deep green was obtained.

EFFECT OF THE INVENTION

The product and the method of the present invention are free from the problems such as putrefactiveness and large variety of the quality due to the raw material as compared with the conventional products and method using the photosensitive resin made of a natural product such as gelatin and casein and treated by a bichromate salt, and in addition, are free from the environmental pollution problem of sexavalent chromium contained in the waste.

According to the present invention, it is possible to prepare coloured base materials having properties which are suitable for use by changing the ratio of combination of the vinyl monomer having photosensitive group(s) and another vinyl monomer which is copolymerizable with the vinyl monomer and has an affinity for an anionic dyestuff, in the copolymer (A).

In addition, since in the membrane on the surface of the base material such as glass, etc. according to the present invention, chromium is not contained, such a base material having dyed membrane of the present invention is favorably suitable for use in a liquid crystal television set and a colour filter of a solid photographing element.

Furthermore, since the membrane formed by curing the photoreactive resin composition (D) of the present invention is excellent in dyeability, it is possible to reduce the thickness of the membrane, and accordingly, it is possible to apply the base material of the present invention onto the transparent electrode of the liquid crystal colour television set. It is another characteristics that the picture of television is remarkably bright in the case of using the base material of the present invention as compared to the case of using the conventional base material.

We claim:

1. A base material having a dyed membrane on the surface thereof, obtained by applying a photoreactive resin composition (D) comprising (i) a copolymer (A) of a vinyl monomer having photosensitive group(s) and another vinyl monomer which is copolymerizable with said vinyl monomer having photosensitive group(s) and has group(s) having an affinity for an anionic dystuff, wherein said vinyl monomer having photosensitive group(s) is one or more compounds selected from the group consisting of p-cinnamoyloxystyrene, β-cinnamoyloxyethyl vinyl ether, β-cinnamoyloxyethyl acrylate, β-cinnamoyloxyethyl methacrylate, p-(cinnamoyloxymethyl) styrene, p-cinnamylideneacetoxystyrene, β-(furfurylacryloyloxy) ethyl acrylate, β-(furfurylacryloyloxyl) ethyl methacrylate, 7-acryloyloxycoumarine, 7-methacryloyloxycoumarine, 7-hydroxymethylcoumarine acrylate, 6-hydroxymethylcoumarine methacrylate, β-(p-cinnamoylphenoxyethyl) vinyl ether, p-(β-styrylphenyl) acrylate p-(β-styrylphenyl) methacrylate, p-phenylmaleimidoacetoxystyrene, 4'-methacryloyloxy-4-stilbazole and 1-methyl-4-(p-methacryloyloxystyryl) pyridinium methosulfate and said another vinyl monomer which is copolymerizable with said vinyl monomer having photosensitive group(s) and has group(s) having an affinity for an anionic dyestuff is one or more compounds selected from the group consisting of (N,N-dimethylamino) ethyl acrylate, (N,N-dimethylamino) ethyl methacrylate, (N,N-diethylamino) ethyl acrylate, (N,N-diethylamino) ethyl methacrylate, (N,N-dimethylamino) propyl acrylate, (N,N-dimethylamino) propyl methacrylate, (N,N-dimethylamino) propyl acrylamide, (N,N-diethylamino) ethyl vinyl ether, 4-vinylpyridine, diallylamine, 2-hydroxy-3-methacryloyloxypropyltrimethylammonium chloride, methacryloyloxytrimethylammonium chloride, methacryloyloxypropyltrimethylammonium chloride, acryloyloxyethyltrimethylammonium chloride and acryloyloxypropyltrimethylammonium chloride, (ii) an initiator (B) of photo-reaction and (iii) a solvent (C), onto the surface of a base material, thereby forming a membrane on said surface, then irradiating the thus formed membrane with activating light to initate a reaction in said membrane and dyeing the thus treated membrane with an anionic dyestuff.

2. The base material having a dyed membrane on the surface thereof according to claim 1, wherein said solvent is one selected from the group consisting of 2-methoxyethanol, 2-ethoxyethanol, toluene, xylene, ethylene glycol monoethyl ether acetate and N-methyl-2-pyrrolidone.

3. The base material having a dyed membrane on the surface thereof according to claim 1 or 2, wherein (1) the molar ratio of said vinyl monomer having photosensitive group(s) in said copolymer (A) is in a range of 0.2 to 30 mol%; (2) the molar ratio of said another vinyl monomer which is copolymerizable with said vinyl monomer having photosensitive group(s) and has group(s) having an affinity for an anionic dyestuff in said copolymer (A) is more than 20 mol%; (3) not more than 30 parts by weight of said initiator of photo-reaction is used to 100 parts by weight of said copolymer (A) and (4) the viscosity of said photoreactive resin composition (D) is not more than 100 cps.

4. The base material having a dyed membrane on the surface thereof according to claim 1 or 2, wherein said base material is glass or a synthetic resin.

5. A colour filter for use in a liquid crystal colour television set, comprising said base material having a dyed membrane on the surface thereof according to claim 4.

6. A method for dyeing a membrane on the surface of a base material, comprising the steps of (1) applying a photoreactive resin composition (D) comprising (a) a copolymer (A) of a vinyl monomer having photosensitive group(s) an another vinyl monomer which is copolymerizable with said vinyl monomer having photosensitive group(s) and has group(s) having an affinity for an anionic dyestuff, wherein (1) said vinyl monomer having photosensitive group(s) is one or more compounds selected from the group consisting of p-cinnamoyloxystyrene, β-cinnamoyloxyethyl vinyl ether, β-cinnamoyloxyethyl acrylate, β-cinnamoyloxyethyl methacrylate, P-(cinnamoyloxymethyl) styrene, p-cinnamylideneacetoxystyrene, β-(furfurylacryloyloxy) ethyl acrylate, β-(furfurylacryloyloxy) ethyl methacrylate, 7-acryloyloxycoumarin, 7-methacryloyloxycoumarin, 6-hydroxymethylcoumarin acrylate, 6-hydroxymethylcoumarin methacrylate, β-(p-cinnamoylphenoxyethyl) vinyl ether, p-(β-styrylphenyl) acrylate, p-(β-styrylphenyl) methacrylate, p-phenylmaleimidoacetoxystyrene, 4'-methacryloyloxy-4-stilbazole and 1-methyl-4-(p-methacryloyloxystyryl) pyridinium methosulfate and (2) said another vinyl monomer which is copolymerizable with said vinyl monomer having photosensitive group(s) and has group(s) having an affinity for an anionic dyestuff is one or more compounds selected from the group consisting of (N,N-dimethylamino) ethyl acrylates, (N,N-dimethylamino) ethyl methacrylates, (N,N-diethylamino) ethyl acrylates, (N,N-diethylamino) ethyl methacrylates, (N,N-dimethylamino) propyl acrylates, (N,N-dimethylamino) propyl methacrylates, (N,N-dimethylamino) propyl acrylamides, (N,N-diethylamino) ethyl vinyl ethers, 4-vinylpyridine, diallylamine, 2-hydroxy-3-methacryloyloxypropyltrimethyl-ammonium chloride, methacryloyloxyethyltrimethylammonium chlorides, methacryloyloxypropyltrimethylammonium chlorides, acryloyloxyethyltrimethylammonium chlorides and acryloyloxypropyltrimethylammonium chlorides, (b) an initiator (B) of photo-reaction and (c) a solvent (C) onto the surface of said base material, thereby forming a membrane, (2) irradiating the thus formed membrane with an activating light, thereby initiating a reaction in said membrane, and (3) dyeing the thus treated membrane with an anionic dyestuff.

7. The method according to claim 6 wherein said solvent is one selected from the group consisting of 2-methoxyethanol, 2-ethoxyethanol, toluene, xylene, ethylene glycol monoethylether acetate and N-methyl-2-pyrrolidone.

8. The method according to claim 6 or 7, wherein the molar ratio of said vinyl monomer having photosensitive group(s) is in a range of 0.2 to 30% in said copolymer (A); the molar ratio of said another vinyl monomer which is copolymerizable with said vinyl monomer having photosensitive group(s) and has group(s) having an affinity for an anionic dyestuff is no less than 20 mol % in said copolymer (A); not more than 30 parts by weight of said initiator (B) of photo-reaction is used to 100 parts by weight of said copolymer (A) and the viscosity of said photoreactive resin composition (D) is not more than 1000 cps.

9. The method according to claim 6, or 7, wherein said base material is glass or a synthetic resin.

* * * * *